United States Patent [19]

Garverick

[11] Patent Number: 4,896,156
[45] Date of Patent: Jan. 23, 1990

[54] SWITCHED-CAPACITANCE COUPLING NETWORKS FOR DIFFERENTIAL-INPUT AMPLIFIERS, NOT REQUIRING BALANCED INPUT SIGNALS

[75] Inventor: Steven L. Garverick, Galway, N.Y.

[73] Assignee: General Electric Company, Schenectady, N.Y.

[21] Appl. No.: 252,484

[22] Filed: Oct. 3, 1988

[51] Int. Cl.[4] ............................................. H03M 3/02
[52] U.S. Cl. ..................................... 341/143; 341/172; 332/106; 375/28
[58] Field of Search ............... 341/122, 143, 144, 155, 341/158, 167, 172; 332/11 D; 375/26, 27, 28, 33

[56] References Cited

U.S. PATENT DOCUMENTS 4,119,960 10/1978 Hill ........................................ 341/163
4,542,354 9/1985 Robinton et al. ................. 332/11 D
4,733,171 3/1988 Milkovic ............................. 324/142
4,837,527 6/1989 Sauer ................................... 341/167

OTHER PUBLICATIONS

"A Use of Limit Cycle Oscillators to Obtain Robust Analog to Digital Converters", J. G. Candy, IEEE Transactions on Communications, vol. COM-27, No. 3, pp. 298-305, Mar. 1974.
"Using Triangularly Weighter Interpolation to Get 13-Bit PCM from a Sigma-Delta Modulator", J. G. Candy et al., IEEE Transactions on Communications, vol. COM-24, No. 11, pp. 1268-1275, Nov. 1976.
"A Use of Double Integration in Signal Delta Modulation", J. G. Candy, IEEE Transactions on Communications, vol. COM-33, No. 3, pp. 249-258, Mar. 1985.
"Circuit and Technology Considerations for MOS Delta-Sigma A/D Converters", M. W. Hauser et al., 1986, IEEE International Symposium on Circuits and Systems Proceedings, pp. 1310-1315, May 1986.
"A Low-Noise Chopper-Stabilized Differential Switched-Capacitor Filtering Technique", K.-C. Hsieh et al., IEEE Journal of Solid-State Circuits, vol. SC-16, No. 6, pp. 458-465, Dec. 1981.

Primary Examiner—William M. Shoop, Jr.
Assistant Examiner—Brian K. Young
Attorney, Agent, or Firm—Allen L. Limberg; James C. Davis, Jr.; Marvin Snyder

[57] ABSTRACT

A differential delta-sigma modulator of switched-capacitance type is operated with a three-phase cycle, rather than the two-phase cycle of the prior art. In the first phase of operation the switched capacitors are charged in accordance with the previous single-bit output of the modulator. Structural modifications permit the switching capacitors to be connected in series to receive the modulator input voltage during the second phase of operation so that voltage need not be balanced with regard to any specified common-mode potential. In the third phase of operation the switched capacitors discharge from first plates thereof to the differential-input integrator while the second plates thereof are driven in accordance with the previous single-bit output of the modulator.

18 Claims, 7 Drawing Sheets

SWITCHED-CAPACITANCE COUPLING NETWORKS FOR DIFFERENTIAL-INPUT AMPLIFIERS, NOT REQUIRING BALANCED INPUT SIGNALS

The invention relates to switched capacitance coupling networks for differential-input amplifiers, as may be used for example in delta-sigma modulators, also known as sigma-delta modulators, found in analog-to-digital converters of simple and multiplicative types.

BACKGROUND OF THE INVENTION

Delta-sigma modulators have been used in analog-to-digital converters for some time. The reader is referred to the following technical articles incorporated herein by reference.

(1) "A Use of Limit Cycle Oscillators to Obtain Robust Analog to Digital Converters", J. G. Candy, IEEE TRANSACTIONS ON COMMUNICATIONS, Vol. COM-27, No. 3, pp. 298-305, March 1974

(2) "Using Triangularly Weighted Interpolation to Get 13-Bit PCM from a Sigma-Delta Modulator", J. G. Candy, et al., IEEE TRANSACTIONS ON COMMUNICATIONS, Vol. COM-24, No. 11, pp. 1268-1275, November 1976

(3) "A Use of Double Integration in Signal Delta Modulation", J. G. Candy, IEEE TRANSACTIONS ON COMMUNICATIONS, Vol. COM-33, No. 3, pp. 249-258, March 1985

(4) "Circuit and Technology Considerations for MOS Delta-sigma A/D Converters", M. W. Hauser, et al., 1986, IEEE INTERNATIONAL SYMPOSIUM ON CIRCUITS AND SYSTEMS PROCEEDINGS, pp. 1310-1315, May 1986

(5) A Low-Noise Chopper-Stabilized Differential Switched-Capacitor Filtering Technique", K.-C. Hsieh, et al., IEEE JOURNAL OF SOLID-STATE CIRCUITS, Vol. SC-16, No. 6, pp. 708-715, December 1981

In a delta-sigma modulator an analog input signal has a quantized analog signal subtracted therefrom to generate an error signal. This error signal is integrated over time, and the resulting integral is supplied to a quantizer to be digitized. The quantizer includes means for generating the quantized analog signal as well, such as a digital-to-analog converter for the digital signal from the quantizer, completing a direct feedback connection. The delta-sigma modulator is operated at a relatively high sample rate $f_s$ compared to the rate $f_{out}$ at which an interpolated value of digitized input signal is to be developed as a final output signal of the analog-to-digital converter. The digital output signal from the quantizer of the delta-sigma modulator is then subjected to averaging over cycle of repeated operations of the delta-sigma modulator, $f_s/f_{out}$ in number. This averaging may be done by accumulating the digital output from the quantizer over $(f_s/f_{out})$ operations, then dividing the accumulation by $(f_s/f_{out})$ to obtain an interpolated value of the digitized input signal as output signal. This division is a simple matter of binary place shifting when $(f_s/f_{out})$ is an integral power of two. This paragraph has described a first-order delta-sigma modulator, with a single integrator included in the direct feedback loop, per the March 1974 J. G. Candy article, being used to implement an oversample and decimate analog to digital converter.

One may view the averaging to obtain the interpolated value of the digitized input signal as being a low-pass digital filtering procedure used to suppress quantizing noise, which is above-band. Low-pass filtering techniques for suppressing quantizing noise that are more sophisticated than the simple accumulate-and-divide technique are known—e.g., from the November 1976 Candy et alii article which describes triangularly weighted kernels for such filtering. With ideal low-pass filtering for suppressing quantizing noise, effectively the number N of bits of resolution in the output signal of the prior-art analog-to-digital converter using a first-order delta-sigma modulator is approximately $[1.5 \log_2 (f_s/f_{out})] - 0.9$.

In addition to first-order delta-sigma modulators, delta-sigma modulators with additional integrating loops are also possible. This is described in the March 1985 J. G. Candy article.

As pointed out by Hauser et alii, there are many different forms of oversample and decimate analog-to-digital converters, but those of especial interest are the ones where the error signal is forced to have single-bit resolution, inasmuch as this avoids the need for precision binary elements in the digital-to-analog converter used to complete the feedback loop. The goal is to obtain maximum precision in the analog-to-digital process with minimal requirement for precision in the circuit elements employed in the analog-to-digital converter.

Hsieh et alii point out that achievement of this goal is furthered by the use of differential chopper-stabilized configurations, particularly in switched-capacitor designs using metal-oxide-semiconductor field effect transistors (MOSFETs) as switches. Chopper stabilization of the differential amplifier in the integrator also translates its low-frequency, or 1/f, noise above-band where it is suppressed by the delta-sigma modulator output signal digital filter. A drawback of the Hsieh et alii analog-to-digital converter is its need for balanced push-pull analog input signals. As noted by Hauser et alii, performance of delta-sigma analog-to-digital converters using MOSFET switches is usually constrained by analog circuit imperfections. One problem is providing sources of differential input signals that are balanced in regard to a fixed common-mode voltage and balanced well.

SUMMARY OF THE INVENTION

An object of the invention is avoiding the need for push-pull input signals that are balanced in regard to a fixed common-mode voltage in order to apply a difference voltage between the inverting and non-inverting input connections of a differential amplifier, such as that employed in a differential delta-sigma modulator, by way of example. This object is attained using a three-phase operation, rather than the two-phase operation of prior art switched-capacitance coupling networks.

A switched-capacitance coupling network in accordance with the invention responds to the difference between voltages appearing respectively at first and second nodes for applying that difference between the inverting and non-inverting input connections of a differential amplifier (or other differential-input circuit). A third node receives the common-mode voltage for that amplifier. Fourth and fifth nodes receive respective voltages, one of which is positive in a given amount respective to the common-mode voltage and the other of which is negative in the same given amount respective to the common-mode voltage. Means are provided for generating in staggered phase relationship a first train of pulses, a second train of pulses and a third train of pulses, pulses of which occur cyclically in order of their train number and do not overlap. Means are provided for selectively connecting first plates of a first capacitor and a second capacitor to the third node only during each pulse of the first trains. Means are provided for selectively connecting second plates of the first and second capacitors to separate ones of the first and second nodes only during each pulse of the second train. Means are provided for selectively connecting the first plates of the first and second capacitors to separate ones of the fourth and fifth nodes only during intervals between pulses in the second train. Means are provided for connecting the first plates of the first and second capacitors solely to each other during pulses in the second train.

The invention is embodied, for example, in a differential delta-sigma modulator having means for generating in staggered phase relationship a first train of pulses, a second train of pulses and a third train of pulses. Pulses of these trains occur cyclically in order of the number of their trains and do not overlap in duration. There are means for selectively connecting the first plates of first and second capacitors to a common-mode potential only during each pulse of the first train, means for selectively connecting the first plates of the first and second capacitors solely to each other during each pulse of the second train and means for selectively connecting the second plates of said first and second capacitors to first and second input terminals of the differential delta-sigma modulator respectively only during each pulse of the second train. A differential-input differential-output differential amplifier is connected as an integrator, with a third capacitor connected between one of its output connections and one of its input connections, and with a fourth capacitor connected between the other of its output connections and the other of its input connections. Means are provided for selectively connecting the first plates of said first and second capacitors to respective ones of the input connections of the differential amplifier only during pulses of the third train. The voltage between the output connections of the differential amplifier is supplied to an analog-to-digital converter to be resolved to a single-bit output signal supplied in push-pull at first and second output connections of the converter. Means are provided for selectively connecting the second plates of the first and second capacitors to respective ones of the first and second output connections of the analog-to-digital converter only during intervals between pulses in the second train, including times when pulses appear in the first train and times when pulses appear in the third train.

Figure 1:
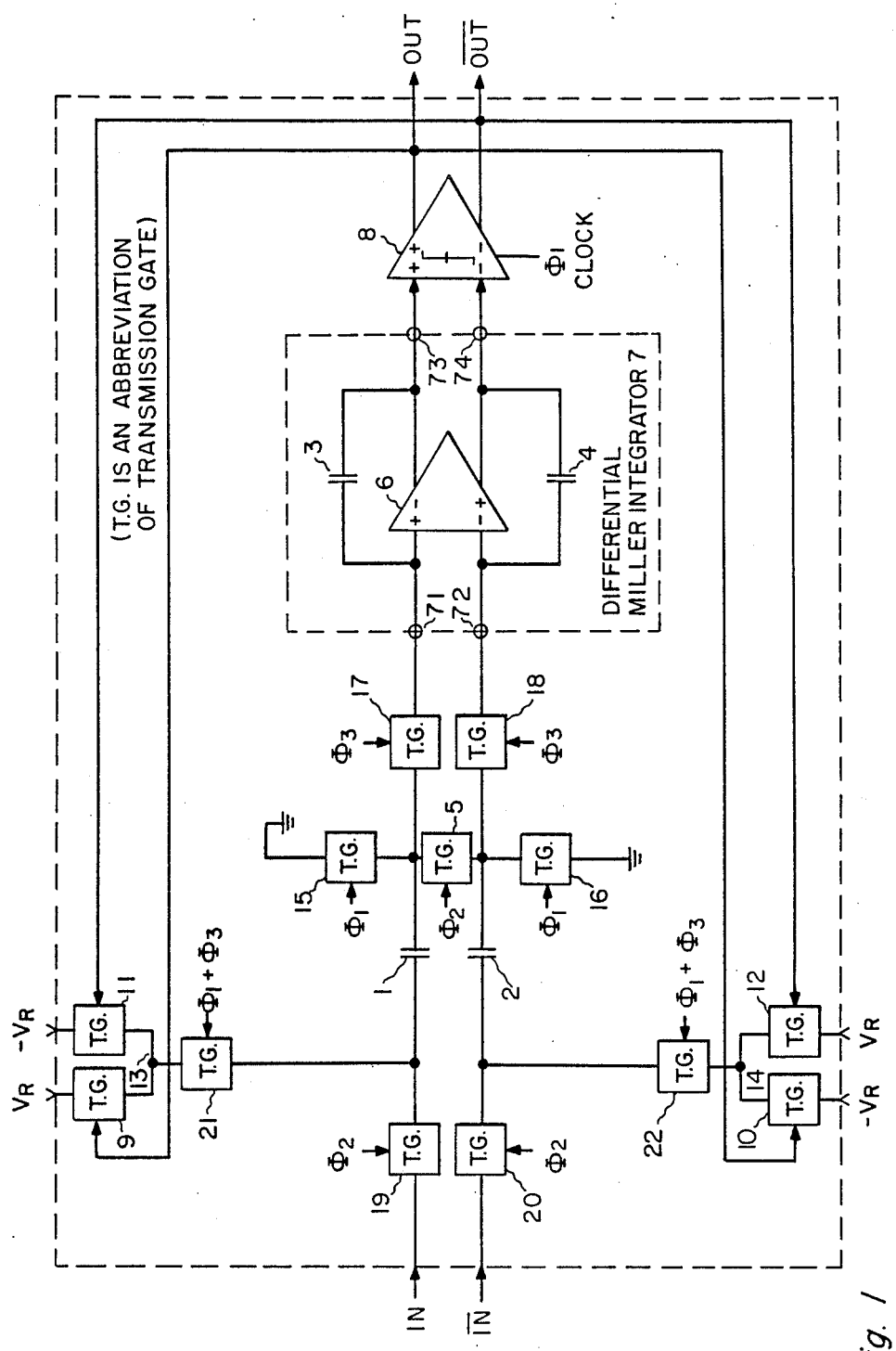
FIG. 1 is a schematic diagram of a delta-sigma modulator embodying the invention.
Figure 6:
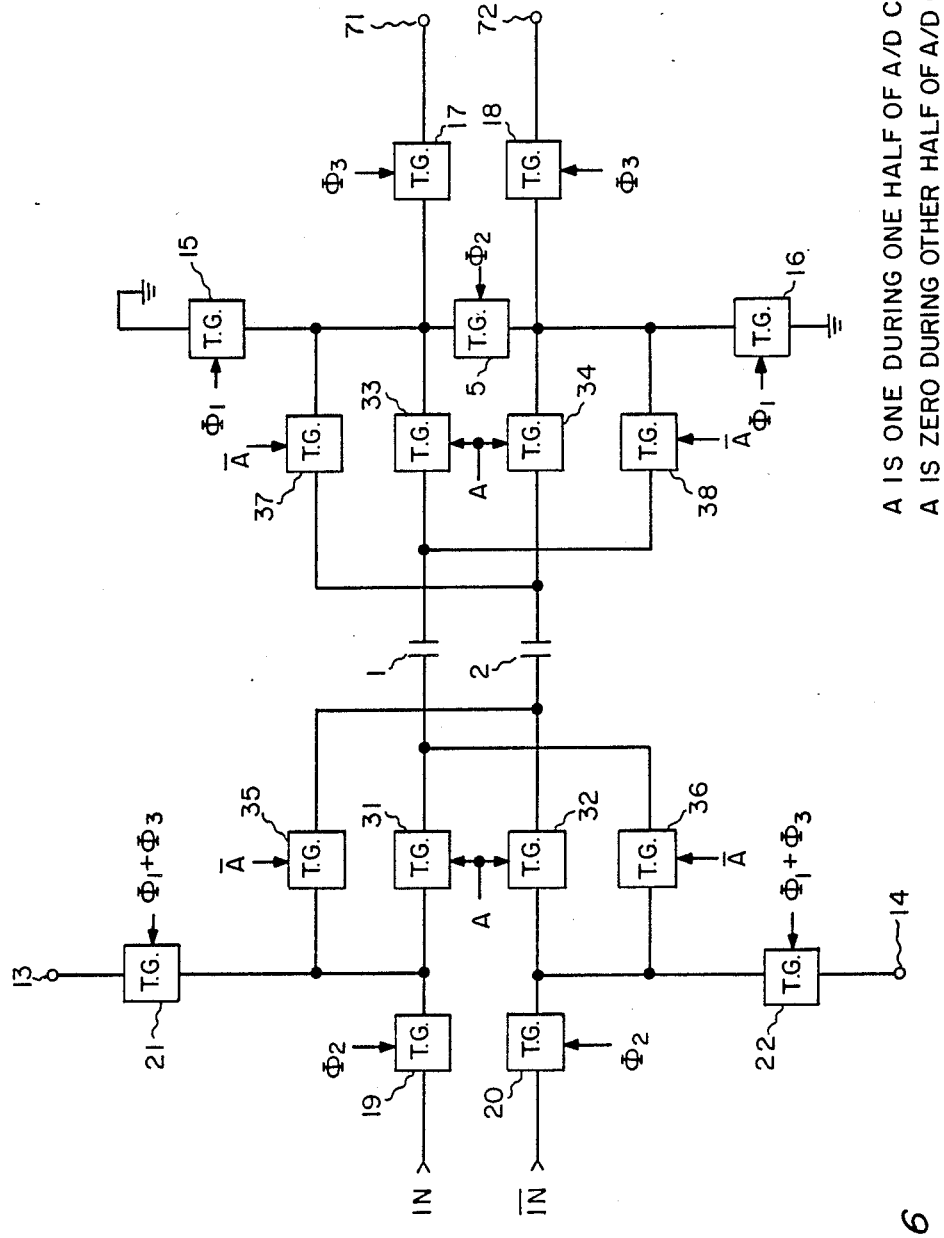
Figure 7:
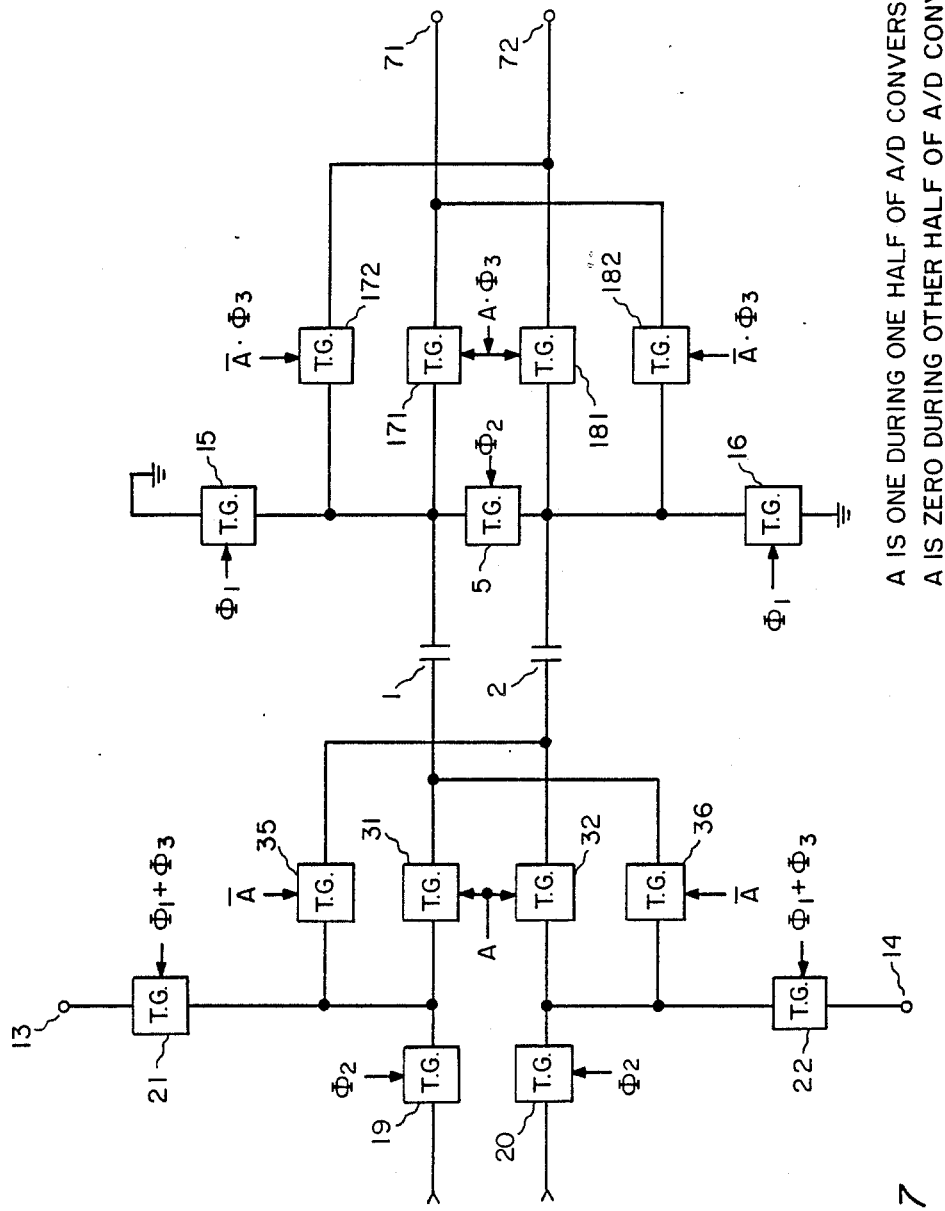
Figure 8:
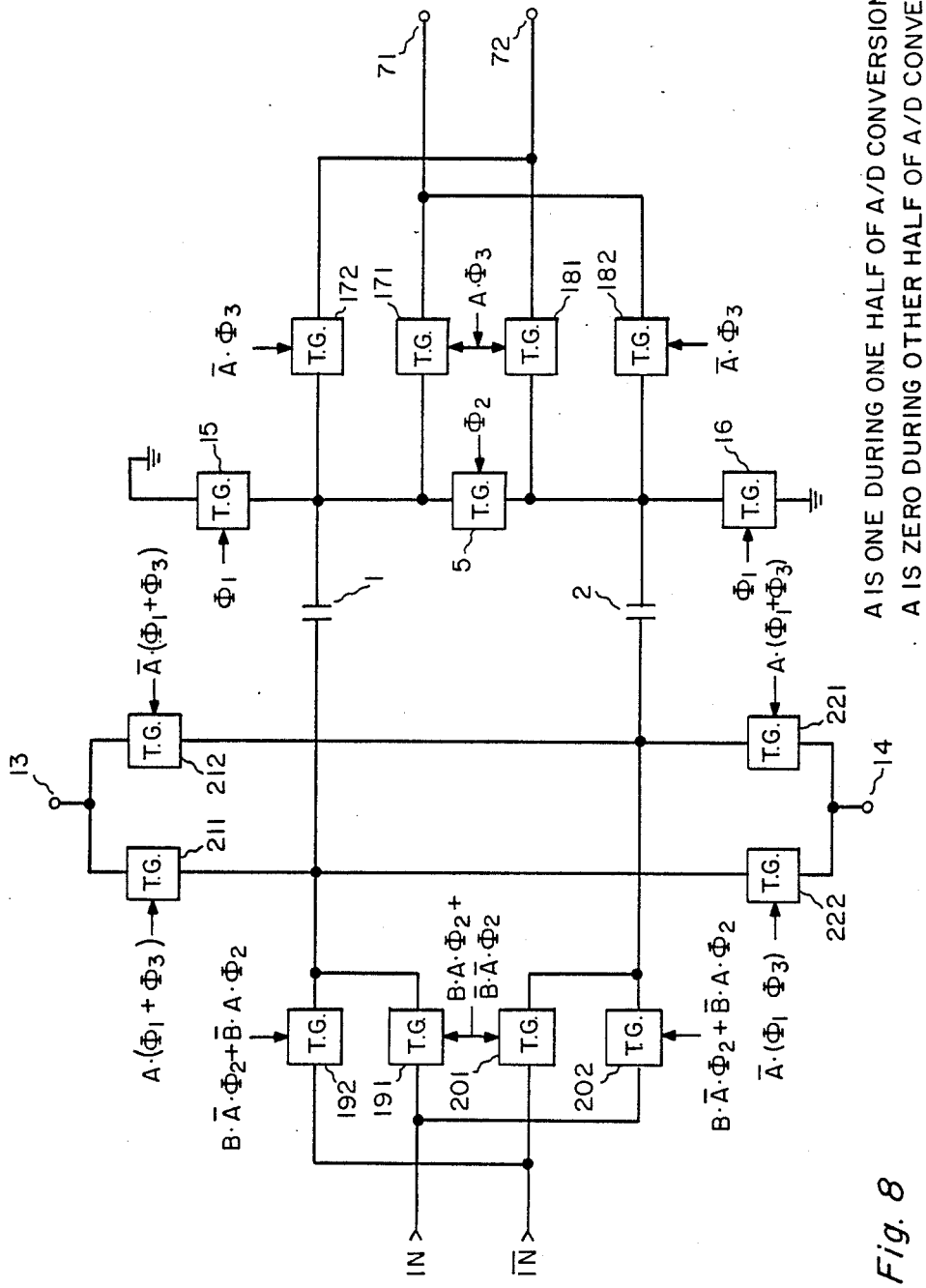

Each of FIGS. 6, 7 and 8 is a schematic diagram of a modification that can be made to FIG. 1 delta-sigma modulator, to provide an alternative delta-sigma modulator embodying the invention and providing for dynamic matching of the switched capacitances therein.

Figure 9:
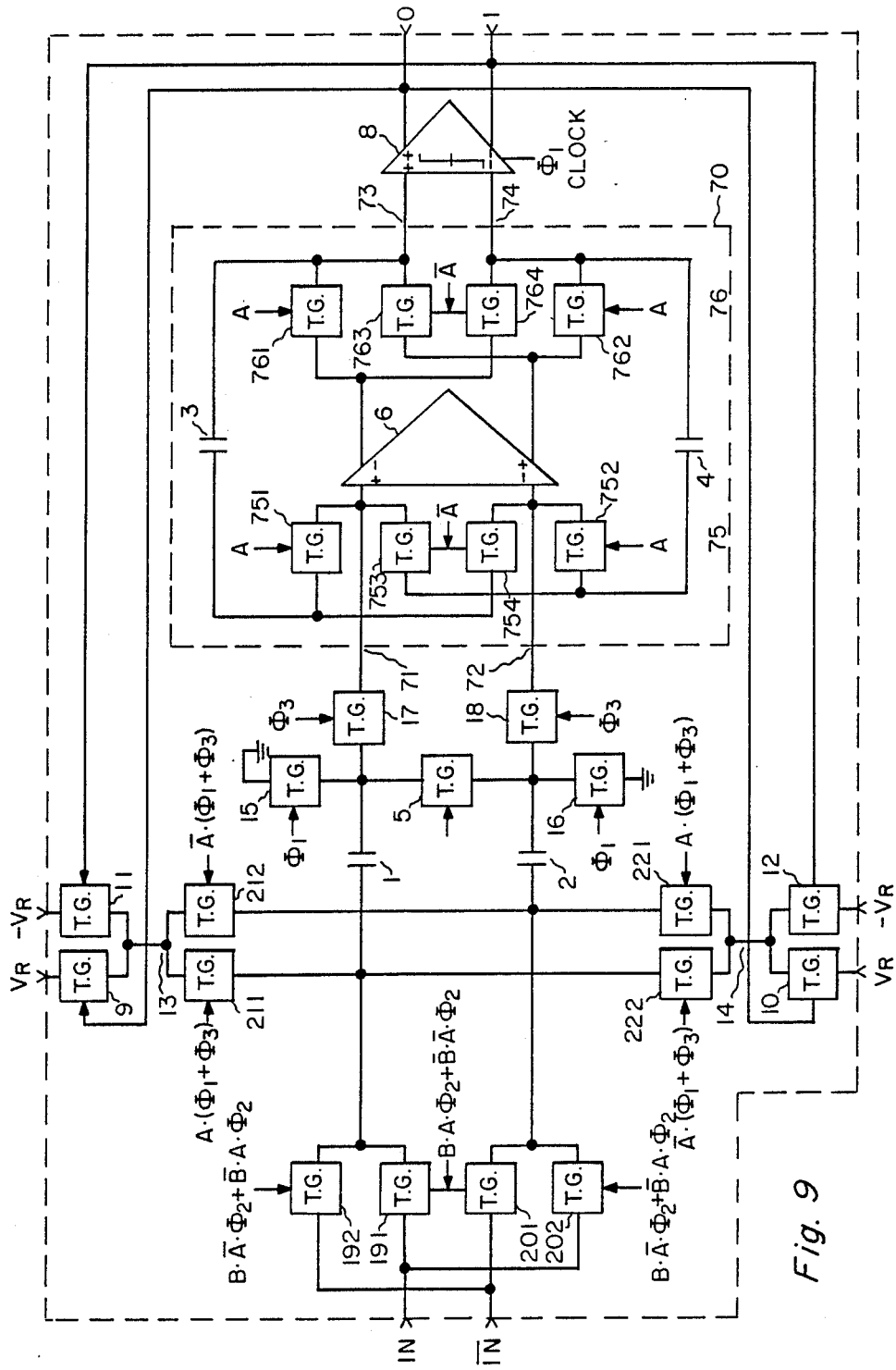

FIG. 9 is a schematic diagram of a modification employing multiplexing.

DETAILED DESCRIPTION

The FIG. 1 delta-sigma modulator is a switched-capacitor type. The switches are provided by transmission gates, each labelled "T.G.". In actual practice, where complementary metal-oxide-semiconductor (CMOS) technology is used, each transmission gate will be provided by a p-channel field-effect transistor and an n-channel field-effect transistor, both of enhancement-mode type, with their channels connected in parallel to provide a selectively conductive path through the transmission gate. A ONE control signal which renders the transmission gate conductive comprises a signal component voltage swinging close to negative operating supply voltage being applied to the gate electrode of the p-channel FET and a signal component voltage swinging close to positive operating supply voltage being applied to the gate electrode of the n-channel FET. A ZERO control signal which renders the transmission gate non-conductive comprises a signal component voltage swinging close to positive operating supply voltage being applied to the electrode of the p-channel FET and a signal component voltage swinging close to negative operating supply voltage being applied to the gate electrode of the n-channel FET.

The FIG. 1 delta-sigma modulator is a modification of a delta-sigma modulator using the fully differential switched capacitor integrator shown in FIG. 7 of the Hsieh et alii article. A part of this modification is the inclusion of a further transmission gate 5 for selectively connecting the first plates of a first switched capacitor 1 and a second switched capacitor 2. These capacitors 1 and 2 can be provided in integrated circuitry by structures similar to FETs, as is commonly known. The remainder of the modification concerns differences in the timing of the selective connections provided by the various transmission gates so as to provide for operation irrespective of whether or not the potentials applied between input terminals IN and IN of the FIG. 1 delta-sigma modulator are balanced against a ground potential.

A differential amplifier 6 and a differential voltage comparator 8 have positive operating potentials and negative operating potentials with reference to this ground potential. The differential-input/differential-output differential amplifier 6 has its +,− output connections connected to its −,+ input connections via similar-value feedback capacitors 3 and 4, thus to provide a differential Miller integrator having push-pull connections 71, 72 and push-pull output connections 73, 74. Capacitor 3 provides a first Miller feedback connection between output connection 73 and input connection 71, and capacitor 4 provides a second Miller feedback connection between output connection 74 and input connection 72. The clocked differential-input/differential-output voltage comparator 8 that follows this integrator 7 in FIG. 1 functions as a one-bit analog-to-digital converter supplying push-pull digital response to output terminals OUT and OUT of the FIG. 1 delta-sigma modulator.

The one-bit digital response from comparator 8 controls the push-pull conduction of transmission gates 9 and 11 to place a node 13 at $+V_R$ or at $-V_R$ potential as referred to the common-mode potential (ground). This one-bit digital response also controls the push-pull conduction of transmission gates 10 and 12 to place a node 14 at $-V_R$ or at $+V_R$ as referred to a ground potential. That is, one of nodes 13 and 14 is clamped to $+V_R$ potential and the other to $-V_R$ potential at any given time, which being clamped to $+V_R$ and which being clamped to $-V_R$ being determined by the one-bit digital response from voltage comparator 8.

Figure 2:
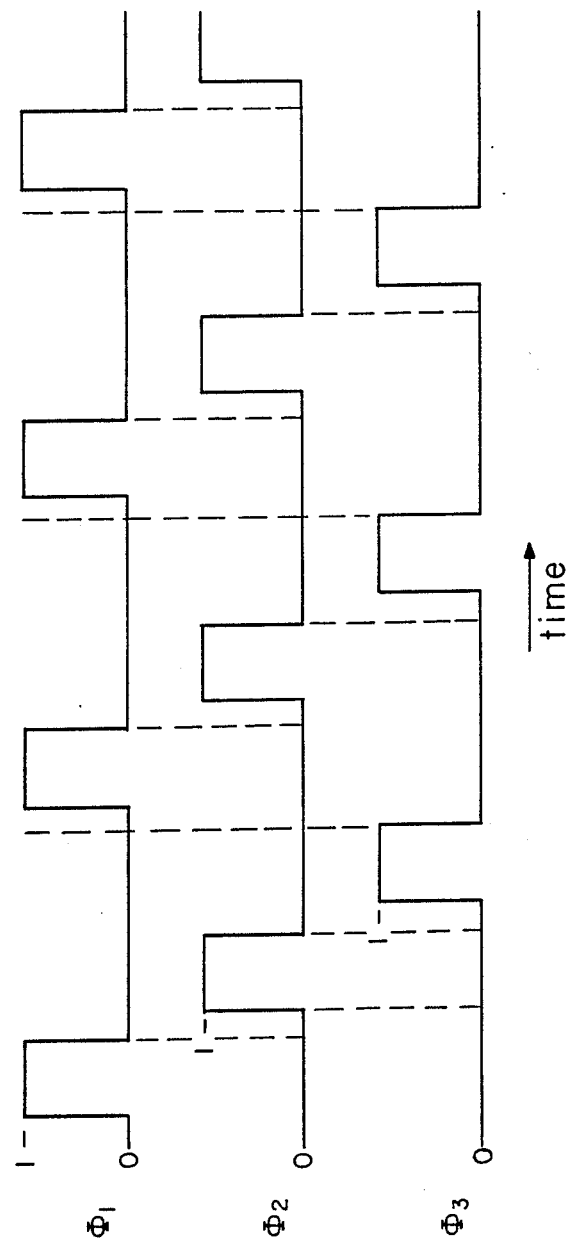
FIG. 2 is a timing diagram that shows the successive, non-overlapping $\Phi_1$, $\Phi_2$ and $\Phi_3$ clock pulses used to control operation of the FIG. 1 delta-sigma modulator.

FIG. 2 timing diagram shows the three pulse trains of staggered-phase clock signals $\Phi_1$, $\Phi_2$, and $\Phi_3$ used to control operation of the FIG. 1 delta-sigma modulator. The $\Phi_1$, $\Phi_2$, and $\Phi_3$ pulses occur cyclically in order of subscript number and are non-overlapping.

Responsive to a $\Phi_1$ clock pulse, transmission gates 15 and 16 are conductive to clamp the right plates of switched capacitors 1 and 2 respectively to common-mode potential ground. At this time, as in the prior art, transmission gates 17 and 18 are non-conductive to disconnect the first plates of capacitors 1 and 2 from the input connections of 71 and 72 differential Miller integrator 7 respectively. However, in contradistinction to prior art practice, transmission gates 19 and 20 are not made conductive to clamp the left plates of capacitors 1 and 2 to input connections IN and IN. Instead, transmission gates 21 and 22 are made conductive to clamp the left plates of capacitors 1 and 2 to node 13 and to node 14, respectively, during the $\Phi_1$ and $\Phi_3$ clock signals. This can be done by ORing the $\Phi_1$ and $\Phi_3$ clock signals to control transmission gates 21 and 22. Alternatively pulses can be supplied that overlap consecutive $\Phi_3$ and $\Phi_1$ clock signals being ONE but do not overlap $\Phi_2$ clock signal being ONE, for controlling transmission gates 21 and 22.

Figure 3:
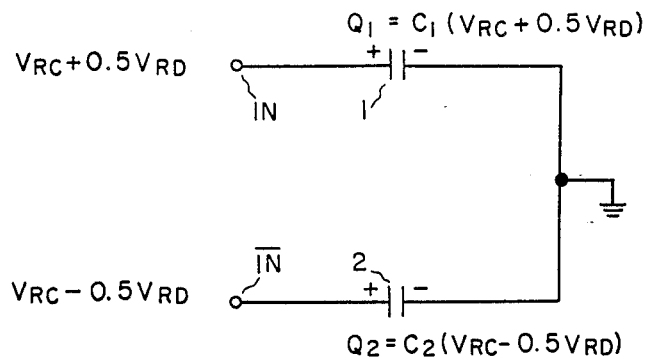
FIGS. 3 and 4 illustrate the charge conditions on the switched capacitors of the FIG. 1 delta-sigma modulator at times near the end of a $\Phi_1$ clock pulse and near the end of a $\Phi_2$ clock pulse, respectively.

FIG. 3 illustrates the charge conditions attained on switched capacitors 1 and 2 near the end of the $\Phi_1$ clock pulse. $+V_R$ and $-V_R$ can be considered as comprising common-mode voltage $V_{RC}$ and differential-mode voltage $V_{RD}$ components as defined by solving the following equations:

$$+V_R = V_{RC} + 0.5 V_{RD}$$

$$-V_R = V_{RC} - 0.5 V_{RD}$$

The charge $Q_1$ placed between the right and left plates of capacitor 1 during $\Phi_1$ clock pulse and the charge $Q_2$ placed between the right and left plates of capacitor 2 during $\Phi_1$ clock pulse are determined in accordance with Coulomb's Law to be as follows, where $C_1$ and $C_2$ are the capacitances of capacitors 1 and 2 respectively.

$$Q_1 = C_1(V_{RC} + 0.5 V_{RD})$$

$$Q_2 = C_2(V_{RC} - 0.5 V_{RD})$$

The sum of these charges $(Q_1 + Q_2) = (C_1 + C_2) V_{RC}$, is what is of particular interest when $\Phi_1$ clock pulse concludes.

When the $\Phi_2$ clock pulse occurs a short time later, transmission gates 15–18, 21 and 22 are all non-conductive. Transmission gate 5 is rendered conductive responsive to $\Phi_2$ clock pulse to provide short-circuit connection between the right plates of capacitors 1 and 2, which connects these capacitors in series. The $\Phi_2$ clock pulse also conditions the transmission gates 19 and 20 to be conductive to connect the left plates of capacitors 1 and 2 to the input terminals IN and IN respectively. that is, input voltages $V_{IN-1}$ and $V_{IN-2}$ are applied to the left plates of capacitors 1 and 2 at a time when their interconnected right plates are free to assume their own potential, rather than being clamped to ground potential per prior-art practice.

Figure 4:
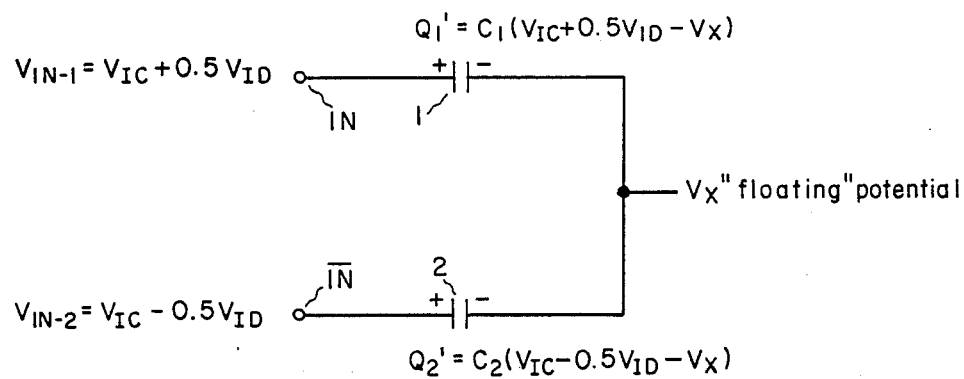

FIG. 4 illustrates the equilibrium charge conditions attained on capacitors 1 and 2 near the end of the $\Phi_2$ clock pulse. Since any displacement current flowing from one of the capacitors 1 and 2 is caused to flow into the other at this time, there is perforce conservation of the sum charge $(Q_1 + Q_2)$. The difference in charges $Q_1$ and $Q_2$—i.e. $(Q_1 - Q_2)$—will change responsive to $(V_{IN-1} - V_{IN-2})$ differing from $V_{RD}$. $V_{IN-1}$ and $V_{IN-2}$ can each be considered as comprising common-mode voltage $V_{IC}$ and differential-mode voltage $V_{ID}$ components as defined by solving the following equations:

$$V_{IN-1} = V_{IC} + 0.5 V_{ID}$$

$$V_{IN-2} = V_{IC} - 0.5 V_{ID}$$

A potential $V_x$ appears at the floating interconnected right plates of capacitors $C_1$ and $C_2$. The charges $Q_1'$ and $Q_2'$ stored in capacitors 1 and 2 near the end of the $I_2$ clock pulse have the following values, as determined in accordance with Coulomb's Law.

$$Q_1' = C_1(V_{IN-1} - V_x) = C_1[V_{IC} + 0.5 V_{ID} - V_x]$$

$$Q_2' = C_2(V_{IN-2} - V_x) = C_2[V_{IC} - 0.5 V_{ID} - V_x]$$

The value of $V_x$ can be calculated as follows, beginning with the observation that total charge in capacitors 1 and 2 is conserved.

$$Q_1 + Q_2 - Q_1' + Q_2'$$

$$C_1(V_{RC} + 0.5 V_{RD}) + C_2(V_{RC} - 0.5 V_{RD}) = C_1(V_{IC} + 0.5 V_{ID} - V_x) + C_2(V_{IC} - 0.5 V_{ID} - V_x)$$

$$(C_1 + C_2) V_{RC} + 0.5(C_1 - C_2) V_{RD} = (C_1 + C_2) V_{IC} + 0.5(C_1 - C_2) V_{ID} - (C_1 + C_2) V_x$$

$$(C_1 + C_2) V_x = (C_1 + C_2)(V_{IC} - V_{RC}) + 0.5(C_1 - C_2)(V_{ID} - V_{RD})$$

$$V_x = (V_{IC} - V_{RC}) + [0.5(C_1 - C_2)(V_{ID} - V_{RD})]/(C_1 + C_2)$$

Knowing $V_x$, $Q_1'$ and $Q_2'$ can be defined in terms excluding the dummy variable $V_x$.

$$Q_1' = C_1[V_{IC} + 0.5\ V_{ID} - V_{IC} + V_{RC} - 0.5\ (C_1 - C_2)(V_{ID} - V_{RD})/(C_1 + C_2)]$$
$$= C_1\{V_{RC} + [0.5\ V_{RD}\ (C_1 - C_2)/(C_1 + C_2)] + [V_{ID}\ C_2/(C_1 + C_2)]\}$$
$$Q_2' = C_2[V_{IC} - 0.5\ V_{ID} - V_{IC} + V_{RC} - 0.5\ (C_1 - C_2)(V_{ID} - V_{RD}/(C_1 + C_2)]$$
$$= C_2\{V_{RC} + [0.5\ V_{RD}\ (C_1 - C_2)/(C_1 + C_2)] - [V_{ID}C_1/(C_1 + C_2)]\}$$

The voltages $V_1$ and $V_2$ appearing across capacitors 1 and 2 have the following values, near the end of the $\Phi_2$ clock pulse, then, in accordance with Coulomb's Law.

$$V_1 = V_{RC} + [0.5V_{RD}(C_1-C_2)/(C_1+C_2)] + [V_{ID}C_2/(C_1+C_2)]$$

$$V_2 = V_{RC} + [0.5V_{RD}(C_1-C_2)/(C_1+C_2)] - [V_{ID}C_1/(C_1+C_2)]$$

Figure 5:
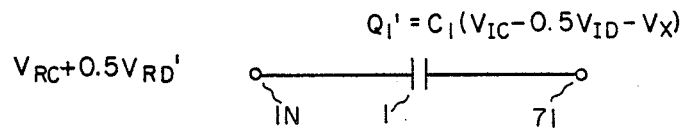
FIG. 5 illustrates the equilibrium charge conditions on the switched capacitors of the FIG. 1 delta-sigma modulator at the beginning of a $\Phi_3$ clock pulse.

A short time after $\Phi_2$ clock pulse ends, the following conditions obtain. Transmission gates 15 and 16 remain non-conductive in the absence of $\Phi_1$ clock pulse. Transmission gates 5, 19, and 20 have just previously become non-conductive responsive to the cessation of $\Phi_2$ clock pulse. Non-conduction of transmission gates 19 and 20 disconnects the input terminals IN and $\overline{\text{IN}}$ from the left plates of capacitors 1 and 2, and non-conduction of transmission gate 5 disconnects the right plates of capacitors 1 and 2 from each other. Transmission gates 21 and 22 become conductive when $\Phi_3$ begins. FIG. 5 illustrates the conditions appearing on switched capacitors 1 and 2 at this time, before capacitors 1 and 2 are discharged by the integrator. Charges $Q_1'$ and $Q_2'$ remain on capacitors 1 and 2, and their left plates have $V_{RC}+0.5V_{RD}'$ and $V_{RC}-0.5V_{RD}'$ respectively applied to them. $V_{RD}'$ may equal $V_{RD}$ or $-V_{RD}$, depending on the condition of the differential Miller integrator. The voltages $V_{out-1}$ and $V_{out-2}$ at the right plates of capacitors 1 and 2 have the following values.

$$V_{out-1} = V_{RC}+0.5V_{RD'}-V_1=0.5\ V_{RD'}-[0.5V_{RD}(C_1-C_2)/(C_1+C_2)]-[V_{ID}C_2/(C_1+C_2)]$$

$$V_{out-2} = V_{RC}-0.5V_{RD'}-V_2 = 0.5V_{RD'}-[0.5V_{RD}(C_1-C_2)/(C_1+C_2)]+[V_{ID}C_1/(C_1+C_2)]$$

If $C_1=C_2$, $V_{out-1}$ and $V_{out-2}$ have the following values, which are balanced against ground potential.

$$V_{out-1} = 0.5V_{RD'}-0.5V_{ID}$$

$$V_{out-2} = -0.5V_{RD'}+0.5V_{ID}$$

The absence of any common-mode components in these $V_{out-1}$ and $V_{out-2}$ voltages, irrespective of any common-mode component $V_{IC}$ in the input voltages $V_{IN-1}$ and $V_{IN-2}$ achieves the object of the invention set forth at the beginning of the SUMMARY OF THE INVENTION.

Suppose $C_1=C-\Delta C$ and $C_2=C+\Delta C$. Then, $V_{out-1}$ and $V_{out-2}$ have the following values.

$$V_{out-1}=0.5\ V_{RD'}+0.5\ V_{RD}(\Delta C/C)-0.5\ V_{ID}[1+(\Delta C/C)]$$

$$V_{out-2}=-0.5\ V_{RD'}+0.5\ V_{RD}(\Delta C/C)+0.5\ V_{ID}[1-(\Delta C/C)]$$

The common-mode voltage term, $0.5\ (V_{RD}-V_{ID})(\Delta C/C)$, is small and can be rejected by the amplifier. This common-mode voltage term is independent of any common-mode component $V_{IC}$ in the input voltages $V_{IN-1}$ and $V_{IN-2}$, so that object of the invention is still achieved. The equations for $Q_1'$ and $Q_2'$ can be rewritten in terms of C and $\Delta C$ as follows.

$$Q_1'=C_1[V_{RC}-0.5\ V_{RD}(\Delta C/C)+0.5\ V_{ID}+0.5\ V_{ID}(\Delta C/C)]$$

$$Q_2'=C_2[V_{RC}-0.5\ V_{RD}(\Delta C/C)-0.5\ V_{ID}+0.5\ V_{ID}(\Delta C/C)]$$

These values will be used further on for calculating charge flows into the differential Miller integrator when $C_1$ and $C_2$ differ in value.

During the clock pulse $\Phi_3$, transmission gates 17 and 18 become conductive to connect the right plates of capacitors 1 and 2 to the input connections 71 and 72 respectively of differential Miller integrator 7, the conditions of the other transmission gates 5, 15, 16, and 19-22 insofar as being conductive or non-conductive remaining unchanged. The input impedance at the input connections 71 and 72 to the − and + input connections of differential amplifier 6 appear to be short circuits to a point of low impedance at a voltage which tracks to good approximation the common-mode voltage term $0.5\ (V_{RD}-V_{ID})(\Delta C/C)$ of $V_{out-1}$ and $V_{out-2}$. The charges $Q_1''$ and $Q_2''$ appearing on capacitors $C_1$ and $C_2$ near the end of the $\Phi_3$ clock pulse are defined as follows, in accordance with Coulomb's Law.

$$Q_1'' = C_1\ [V_{RC} + 0.5\ V_{RD'} - 0.5\ (V_{RD} + V_{ID})(\Delta C/C)]$$
$$= C_1\ [V_{RC} + 0.5\ V_{RD'} - 0.5\ V_{RD}\ (\Delta C/C) + 0.5\ V_{ID}\ (\Delta C/C)]$$
$$Q_2'' = C_2\ [V_{RC} - 0.5\ V_{RD'} - 0.5\ (V_{RD} + V_{ID})(\Delta C/C)]$$
$$= C_2\ [V_{RC} - 0.5\ V_{RD'} - 0.5\ V_{RD}\ (\Delta C/C) + 0.5\ V_{ID}\ (\Delta C/C)]$$

The charge flows into the differential Miller integrator are, then, as follows:

$$Q_1' - Q_1'' = C_1 [V_{RC} - 0.5\ V_{RD} (\Delta C/C) + 0.5\ V_{ID} + 0.5\ V_{ID} (\Delta C/C)] -$$
$$C_1 [V_{RC} + 0.5\ V_{RD}' - 0.5\ V_{RD} (\Delta C/C) + V_{ID} (\Delta C/C)]$$
$$= 0.5\ C_1 (V_{ID} - V_{RD}')$$
$$Q_2' - Q_2'' = C_1 [V_{RC} - 0.5\ V_{RD} (\Delta C/C) - 0.5\ V_{ID} + 0.5\ V_{ID} (\Delta C/C)] -$$
$$C_1 [V_{RC} - 0.5\ V_{RD}' - 0.5\ V_{RD} (\Delta C/C) + 0.5\ V_{ID} (\Delta C/C)]$$
$$= -0.5\ C_1 (V_{ID} - V_{RD}')$$

The $+0.5\ C\ (V_{ID}-V_{RD}')$ and $-0.5\ C\ (V_{ID}-V_{RD}')$ terms of the expressions $Q_1'-Q_1''$ and $Q_2'-Q_2''$ are the desired terms. The common-mode $0.5\ \Delta C$ charge is not of too much concern because of the common-mode rejection of the amplifier.

When parasitic capacitances are present between the right plates of capacitors 1 and 2 and ground, a mismatch in the parasitics or the interaction of these parasitics with a mismatch between capacitors 1 and 2, or both can cause an injection of differential charge into the integrator in response to a common-mode input.

The effect of this on the accuracy of an analog-to-digital conversion can be greatly reduced by performing one half of each analog-to-digital conversion with the positions of capacitors 1 and 2 connected as shown in FIG. 1, performing the other half of each analog-to-digital conversion with the positions of capacitors 1 and 2 reversed, and averaging the comparator outputs. Where digital low-pass filtering is done by accumulation and division of the accumulation results by the number of samples accumulated, the averaging is simply done by accumulating over the period of the analog-to-digital conversions and dividing the accumulation by the number of samples accumulated during the conversions. The analog-to-digital conversions are each done over a sufficient number of samples to provide substantial oversampling, so as to obtain improved resolution during averaging.

Per the Hauser et alii article, because of thermal noise in the equivalent restances of the switched channels of the transmission gates, each voltage sampled onto a capacitance C exhibits an uncertainty of variance kT/C where k is Boltzmann's constant and T is absolute temperature. The invention causes the switched capacitors 1 and 2 to see three switch paths per clock cycle rather than two. However, the noise introduced during the $\Phi_1$ clock pulse is unimportant, since it only affects the common-mode voltage presented to the amplifier and can easily be rejected. Thus, the performance of the invention in the presence of thermal noise is not significantly degraded with respect to a two-phase implementation.

FIG. 6 shows a modification of the FIG. 1 delta-sigma modulator that replaces elements 15–22 and allows the swapping of capacitors 1 and 2 to be done in a very straightforward way. The control signal A is ONE during one half of each analog-to-digital conversion cycle, and its complement Ā is ZERO. Transmission gates 31–34 are conductive responsive to their control signal being a ONE; transmission gates 35–38 are non-conductive responsive to their control signal Ā being a ZERO. Capacitors 1 and 2 are connected the same as in FIG. 1. The control signal A is ZERO during the remaining halves of each of the analog-to-digital conversion cycles, and its complement Ā is ONE. Transmission gates 31–34 are non-conductive responsive to their control signal A being ZERO; transmission gates 35–38 are conductive responsive to their control signal Ā being ONE. Capacitor 1 takes the stead of capacitor 2 in FIG. 1, and capacitor 2 takes the stead of capacitor 1.

FIG. 7 shows an alternative modification of the FIG. 1 delta-sigma modulator that swaps connections of capacitors 1 and 2 that saves two transmission gates, and that reduces the number of transmission gates in series connection. (Reducing the number of transmission gates in series desirably provides for lowered switch resistance without having to widen the channels of the switch FETs.) Transmission gates 17, 18, 33, 34, 37, and 38 are dispensed with. Transmission gates 171 and 181 selectively conduct responsive to A and $\Phi_3$ both being ONE to provide the functions of replaced transmission gates 17 and 18 respectively during one half of each analog-to-digital conversion. Transmission gates 172 and 182 selectively conduct responsive to Ā and $\Phi_3$ both being ONE to provide the functions of replaced transmission gates 17 and 18 respectively during the other half of each analog-to-digital conversion. Capacitor 1 and 2 connections are not permuted respective to transmission gates 5, 15 and 16, but this is unnecessary owing to symmetry of connection.

A may alternate between ZERO and ONE at the conversion rate with transitions of A occurring at the mid point of the conversion cycle. Alternatively, A may alternate between ZERO and ONE at an even multiple of the conversion rate, with the transitions of A occurring regularly within consecutive conversion cycles of similar duration.

FIG. 8 shows a modification that can be made to the FIG. 1 delta-sigma modulator that reduces the number of transmission gates in series connection. The FIG. 8 modification also allows digital multiplication of the input signal by a one-bit signal B. This is useful, for example, in providing for analog-to-digital converters of multiplicative type. The output signal of a first delta-sigma modulator receptive of an analog multiplier as input signal and a ONE as B signal generates the signal B for a second delta-sigma modulator that is receptive of an analog multiplicand as input signal. The digital output signal of the second delta-sigma modulator is accumulated and divided, or otherwise digitally low-pass filtered, to obtain a digital product signal. The FIG. 8 delta-sigma modulator may be used in other ways also, in some of which B and B̄ values may not change.

Supposing B is a ONE, transmission gates 191 and 201 serve the functions of replaced transmission gates 19 and 20 respectively during one half of an analog-to-digital conversion, and transmission gates 192 and 202 serve the functions of replaced transmission gates 19 and 20 respectively during the other half of an analog-to-digital conversion. These conditions are reversed if B is a ZERO instead. In either case, transmission gates 211 and 221 serve the functions of replaced transmission gates 21 and 22 respectively during the one half of the analog-to-digital conversion, and transmission gates 212 and 222 serve the functions of replaced transmission gates 21 and 22 respectively during the other half of the analog-to-digital conversion.

Arrangements may be made to chopper-stabilize the operation of the differential-amplifier 6 in any of the embodiments of the invention as thus far described or in variants of them. Chopper stabilization translates the low-frequency (1/f) noise of the input stage of differential amplifier from baseband to sidebands of the chopping frequency where subsequent low-pass filtering can suppress them.

Where the rate of chopper stabilization of differential amplifier 6 is synchronous with the rate at which switched capacitor 1 and 2 connections are swapped, the multiplexing between capacitors 1,2 and the differential amplifier 6 can be combined with the multiplexing between differential amplifier 6 and capacitors 3,4.

FIG. 9 delta-sigma modulator shows such combination in multiplexing. Differential amplifier 6 is included in a differential Miller integrator 70. The connections of integrating capacitors 3 and 4 via-a-vis differential amplifier 6 are swapped when A signal switches state. This is done using a multiplexer 75 comprising transmission gates 751–754 in the input connections of differential amplifier 6 and using a multiplexer 76 comprising transmission gates 761–764 in the output connections of differential amplifier 6. One could cross-multiplex the voltages at the right plates of capacitors 1 and 2 at A signal switching rate, one to complete dynamic matching procedure and then again as a component of the push-pull signal passing through multiplexer 75, before differential amplifier 6. The cascade of two cross-multiplexing procedures would invariably selectively apply the voltages at the right plates of capacitors 1 and 2 to the same + and − input connections of differential amplifier 6. Selectively applying the voltages at the right plates of capacitors 1 and 2 to the + and − connections of differential amplifier 6 during $\Phi_3$ clock pulse using transmission gates 17 and 18 accomplishes the same end with fewer transmission gates.

Other embodiments of the invention thus far described will occur to one skilled in the art and acquainted with the foregoing disclosure and the scope of the claims which follow should be construed to include all variants as fall within the true spirit of the invention. For example, the pi-connection of transmission gates 5, 15 and 16 may be replaced by a tee-connection of properly controlled gates in any of the figures of the drawing. Or, for example, by applying more complex control signals to transmission gates 9–12 in FIGS. 1, 6, and 7 transmission gates 21 and 22 may be replaced by respective direct connections. Or, in FIG. 8, for example, transmission gates 9, 11, 211, 212 may be replaced by just two suitably controlled transmission gates, and transmission gates 10, 12, 221 and 222 may be similarly replaced by just two suitably controlled transmission gates. Or in FIG. 9, for example, by controlling transmission gates 9–12 from the output connections of a further voltage comparator having input connections from the output connections of differential amplifier 6, transmission gates 211, 212, 221 and 222 may be dispensed with and transmission gates 21 and 22 per FIG. 1 used instead to reduce stray capacitances on the left plates of capacitors 1 and 2.

What is claimed is:

1. A switched-capacitance coupling network responsive to the difference between voltages appearing respectively at first and second nodes for applying that difference between first and second input connections of a differential amplifier, said switched capacitor apparatus comprising:

a third node for receiving a common-mode voltage;

fourth and fifth nodes for receiving respective voltages, one of which is positive in a given amount respective to said common-mode voltage and the other of which is negative in said given amount respective to said common-mode voltage, at any given time;

a first capacitor having respective first and second plates;

a second capacitor having respective first and second plates;

means for generating in staggered phase relationship a first train of pulses, a second train of pulses and a third train of pulses, pulses of which trains occur cyclically in order of their train number and do not overlap;

means for selectively connecting the first plates of said first and second capacitors to said third node only during each pulse of said first train;

means for selectively connecting the second plates of said first and second capacitors to separate ones of said first and second nodes only during each pulse of said second train;

means for selectively connecting the first plates of said first and second capacitors to separate ones of first and second input connections of said differential amplifier, only during each pulse of said third train;

means for selectively connecting the second plates of said first and second capacitors to separate ones of said fourth and fifth nodes only during intervals between pulses in said second train including times when pulses appear in said first train and times when pulses appear in said third train; and means for selectively connecting the first plates of said first and second capacitors solely to each other during each pulse of said second train and disconnecting them from each other at least at times their second plates are connected to said fourth and fifth nodes, respectively.

2. A switched-capacitor coupling network as set forth in claim 1, wherein said means for selectively connecting the second plates of said first and second capacitors to separate ones of said first and second nodes is of a type that invariably connects the second plates of said first and second capacitors to said first node and to said second node, respectively; wherein said means for selectively connecting the first plates of said first and second capacitors to separate ones of the first and second input connections of said differential amplifier is of a type that invariably connects the first plates of said first and second capacitors to the first and second input connections, respectively, of said differential amplifier; and wherein said means for selectively connecting the second plates of said first and second capacitors to separate ones of said fourth and fifth nodes is of a type that invariably connects the second plates of said first and second capacitors to said fourth node and to said fifth node, respectively.

3. A switched-capacitance coupling network as set forth in claim 1 having supplied thereto a control signal alternating at regular rate between first and second levels; wherein said means for selectively connecting the second plates of said first and second capacitors to separate ones of said first and second nodes essentially consists of:

means for selectively connecting the second plates of said first and second capacitors to said first and second nodes, respectively, only during each pulse of said second train and said first level of said control signal; and means for selectively connecting the second plates of said first and second capacitors to said second and first nodes, respectively, only during each pulse of said second train and said second level of said control signal.

4. A switched-capacitance coupling network as set forth in claim 3 wherein said means for selectively connecting the second plates of said first and second capacitors to separate ones of said fourth and fifth nodes is of a type that invariably connects the second plates of said first and second capacitors to said fourth node and to said fifth node respectively.

5. A switched-capacitance coupling network as set forth in claim 4 wherein said means for selectively connecting the first plates of said first and second capacitors to separate ones of the first and second input connections of said differential amplifier essentially consists of:

means for selectively connecting the first plates of said first and second capacitors respectively to said first and said second input connections of said differential amplifier only during each pulse of said third train and said first level of said control signal; and means for selectively connecting the first plates of said first and second capacitors respectively to said second and said first input connections of said differential amplifier only during each pulse of said third train and said second level of said control signal.

6. A switched-capacitance coupling network as set forth in claim 1 included in a delta-sigma modulator that also comprises:

said differential amplifier having first and second output connections, its said first and second input connections being respectively inverting and non-inverting respective to said first output connection and being respectively non-inverting and inverting respective to said second input connection;

means connecting said differential amplifier as a differential Miller integrator, which means includes a first Miller feedback connection between the first output and first input connections of said differential amplifier, and a second Miller feedback connection between the second output and second input connections of said differential amplifier;

third and fourth capacitors respectively providing separate ones of said first and second Miller feedback connectors, at any given time; and an analog-to-digital converter for resolving voltage appearing between the first and second output connections of said differential amplifier to a single-bit output signal applied as said respective voltages to said fourth node and to said fifth node.

7. A delta-sigma modulator as set forth in claim 6; wherein said first Miller feedback connection includes said third capacitor having a first plate invariably connected to the first output connection of said differential amplifier and having a second plate invariably connected to the first input connection of said differential amplifier; and wherein said second Miller feedback connection includes said fourth capacitor having a first plate invariably connected to the second output connection of said differential amplifier and having a second plate invariably connected to the second input connection of said differential amplifier.

8. A delta-sigma modulator as set forth in claim 6 having:

means for selectively connecting said third capacitor and said fourth capacitor in said first Miller feedback connection and in said second Miller feedback connection respectively during one half of each analog-to-digital conversion; and means for selectively connecting said third capacitor and said fourth capacitor in said second Miller feedback connection and in said first Miller feedback connection respectively during the remaining half of each analog-to-digital conversion.

9. A differential delta-sigma modulator comprising:
first and second input terminals;
a first capacitor having respective first and second plates;
a second capacitor having respective first and second plates;
a differential amplifier having first and second output connections and having first and second input connections that are respectively inverting and non-inverting input connections insofar as said first output connection is concerned and are respectively non-inverting and inverting input connections insofar as said second output connection is concerned;
a third capacitor connected between the first output connection and first input connection of said differential amplifier;
a fourth capacitor connected between the second output connection and second input connection of said differential amplifier;
an analog-to-digital converter for resolving the voltage between the first and second output connections of said differential amplifier to a single-bit output signal supplied in push-pull at first and second output connections thereof;
means for generating in staggered phase relationship a first train of pulses, a second train of pulses and a third train of pulses, pulses of which said trains occur cyclically in order of their train number and do not overlap;
means for selectively connecting the first plates of said first and second capacitors to a common-mode potential only during each pulse of said first train;
means for selectively connecting the second plates of said first and second capacitors to said first and second input terminals, respectively, only during each pulse of said second train;
means for selectively connecting the first plates of said first and second capacitors to the first and second input connections of said differential amplifier, respectively, only during each pulse of said third train;
means for selectively connecting said second plates of said first and second capacitors to respective ones of the first and second output connections of said analog-to-digital converter only during intervals between pulses in said second train including times when pulses appear in said first train and times when pulses appear in said third train; and
means for selectively connecting the first plates of said first and second capacitors solely to each other during each pulse of said second traind and disconnecting them from each other at least at times their second plates are connected to respective ones of the first and second output connections of said analog-to-digital converter.

10. A differential delta-sigma modulator for performing analog-to-digital conversions each having respective first and second portions of similar duration, said differential delta-sigma modulator comprising:

first and second input terminals;

a first capacitor having respective first and second plates;

a second capacitor having respective first and second plates;

a differential amplifier having first and second output connections and having first and second input connections that are respectively inverting and non-inverting input connections insofar as said first output connection is concerned and are respectively non-inverting and inverting input connections insofar as said second output connection is concerned;

a third capacitor connected between the first output connection and first input connection of said differential amplifier;

a fourth capacitor connected between the second output connection and second input connection of said differential amplifier;

an analog-to-digital converter for resolving the voltage between the first and second output connections of said differential amplifier to a single-bit output signal supplied in push-pull at first and second output connections thereof;

means for generating in staggered phase relationship a first train of pulses, a second train of pulses and a third train of pulses, pulses of which said trains occur cyclically in order of their train number and do not overlap;

means for selectively connecting the first plates of said first and second capacitors to a common-mode potential only during each pulse of said first train;

means for selectively connecting the second plates of said first and second capacitors to separate ones of said first and second terminals only during each pulse of said second train;

means for selectively connecting the first plates of said first and second capacitors to the first and second input connections of said differential amplifier, respectively, only during each pulse of said third train in said first portions of analog-to-digital conversions;

means for selectively connecting the first plates of said first and second capacitors to the second and first input connections of said differential amplifier, respectively, only during each pulse of said third train in said second portions of analog-to-digital conversions;

means for selectively connecting said second plates of said first and second capacitors to separate ones of the first and second output connections of said analog-to-digital converter only during intervals between pulses in said second train including times when pulses appear in said first train and times when pulses appear in said third train, connection being one way during said first portions of analog-to-digital conversions and being the other way during said second portions of analog-to-digital conversions; and means for selectively connecting the first plates of said first and second capacitors solely to each other during each pulse of said second train and disconnecting them from each other at least at times their second plates are connected to separate ones of the first and second output connection of said analog-to-digital converter.

11. A differential delta-sigma modulator as set forth in claim 10 wherein said means for selectively connecting the second plates of said first and second capacitors to separate ones of said first and second terminals only during each pulse in said second train essentially consists of:

means for selectively connecting the second plates of said first and second capacitors to said first and second terminals, respectively, only during each pulse of said second train in said first portions of analog-to-digital conversions; and means for selectively connecting the second plates of said first and second capacitors to said second and first terminals, respectively, only during each pulse of said second train in said second portions of analog-to-digital conversions.

12. A differential delta-sigma modulator as set forth in claim 10 wherein said means for selectively connecting the second plates of said first and second capacitors to separate ones of said first and second terminals only during each pulse in said second train is of a type performing a single-bit multiplication of first input signal received between said first and second terminals by a second input signal.

13. A differential delta-signal modulator for performing analog-to-digital conversions each having respective first and second portions of similar duration, said differential detla-sigma modulator comprising:

first and second input terminals;

a first capacitor having respective first and second and second plates;

a second capacitor having respective first and second plates;

a third capacitor having respective first and second plates;

a fourth capacitor having respective first and second plates;

a differential amplifier having first and second output connections and having first and second input connections that are respectively inverting and non-inverting input connections insofar as said first output connection is concerned and are respectively non-inverting and inverting input connections insofar as said second output connection is concerned;

an analog-to-digital converter for resolving a differential voltage supplied thereto from between the first plates of said third and fourth capacitors, thereby to generate a single-bit output signal supplied in push-pull at first and second output connections thereof;

means for generating in staggered phase relationship a first train of pulses, a second train of pulses and a third train of pulses, pulses of which said trains occurs cyclically in order of their train number and do not overlap;

means for selectively connecting the first plates of said first and second capacitors to a common-mode potential only during each pulse of said first train;

means for selectively connecting the first plates of said first and second capacitors to the first and second input connections of said differential amplifier, respectively, only during each pulse of said third train;

means for selectively connecting said second plates of said first and second capacitors to separate ones of the first and second output connections of said analog-to-digital converter only during intervals between pulses in said second train including times when pulses appear in said first traain and times when pulses appear in said third train, connection being one way during said first portions of analog-to-digital conversions and being the other way during said second portions of analog-to-digital conversions;

means for selectively connecting the first plates of said first and second capacitors solely to each other during each pulse of said second train and disconnecting them from each other at least at times their second plates are connected to separate ones of the first and second output connections of said analog-to-digital converter;

means for selectively connecting the first and second plates of said third capacitor to the first output connection and first input connection of said differential amplifier, respectively, only during said first portions of analog-to-digital conversions;

means for selectively connecting the first and second plates of said third capacitor to the second output connection and second input connection of said differential amplifier, respectively, only during said second portions of analog-to-digital conversions;

means for selectively connecting the first and second plates of said fourth capacitor to the second output connection and first input connection of said differential amplifier, respectively, only during said first portions of analog-to-digital conversions;

means for selectively connecting said fourth capacitor from the first output connection of said differential amplifier to its first input connection only during said second portions of analog-to-digital conversions; and means for selectively connecting the second plates of said first and second capacitors to separate ones of said first and second terminals only during each pulse of said second train in said first portions of analog-to-digital conversions.

14. A differential delta-sigma modulator as set forth in claim 13 wherein said means for selectively connecting the second plates of said first and second capacitors to separate ones of said first and second terminals only during each pulse in said second train essentially consists of:

means for selectively connecting the second plates of said first and second capacitors to said first and second terminals, respectively, only during each pulse of said second train in said first portions of analog-to-digital conversions; and means for selectively connecting the second plates of said first and second capacitors to said second and first terminals, respectively, only during each pulse of said second train in said second portions of analog-to-digital conversions.

15. A differential delta-sigma modulator as set forth in claim 13 wherein said means for selectively connecting the second plates of said first and second capacitors to separate ones of said first and second terminals only during each pulse in said second train is of a type performing a single-bit multiplication of first input signal received between said first and second terminals by a second input signal.

16. A method of applying the difference between first and second input voltages to a differential delta-sigma modulator via first and second input capacitors in a switched-capacitance network, to remove the need for balancing said first and second input voltages, said method cyclically employing the following three steps in listed order;

charging the first and second capacitors in accordance with a previous single-bit output signal from said differential delta-sigma modulator;

connecting the first and second capacitors in series to receive the difference between the first and second input voltages for said differential delta-sigma modulator; and discharging said first and second capacitors from first plates thereof to respective terminals of a differential input circuit of said differential delta-sigma modulator while second plates of said first and second capacitors are driven in accordance with said previous single-bit output signal from said differential delta-sigma modulator.

17. A method of applying the difference between first and second input voltages to a differential delta-sigma modulator via first and second input capacitors in a switched-capacitance network, to remove the need for balancing said first and second input voltages, said method cyclically employing the following three steps in listed order:

differentially charging the first and second capacitors in accordance with a previous single-bit output signal from said differential delta-sigma modulator;

connecting the first and second capacitors in series to receive the difference between the first and second input voltages for said differential delta-sigma modulator; and discharging said first and second capacitors from first plates thereof to respective terminals of a differential input circuit of said differential delta-sigma modulator while second plates of said first and second capacitors are differentially driven in accordance with said previous single-bit output signal from said differential delta-sigma modulator.

18. A method as set forth in claim 17 wherein the step of connecting the first and second capacitors in series includes the substeps of applying said first and second input voltages to separate ones of the second plates of said first and second capacitors; and connecting the first plates of said first and second capacitors to each other at a node free to float in potential as determined by the first and second input voltages applied to the second plates of said first and second capacitors and the charges stored between the plates of each of said first and second capacitors.

* * * * *